US011370321B2

(12) United States Patent
Pennisi et al.

(10) Patent No.: US 11,370,321 B2
(45) Date of Patent: Jun. 28, 2022

(54) METHOD OF OPERATING BATTERY MANAGEMENT SYSTEMS, CORRESPONDING DEVICE AND VEHICLE

(71) Applicant: STMicroelectronics S.r.l., Agrate Brianza (IT)

(72) Inventors: Orazio Pennisi, Pieve Emanuele (IT); Valerio Bendotti, Vilminoredi Scalve (IT); Vittorio D'Angelo, Salerno (IT); Daniele Zella, Rho (IT)

(73) Assignee: STMicroelectronics S.r.L, Agrate Brianza (IT)

( * ) Notice: Subject to any disclaimer, the term of this patent is extended or adjusted under 35 U.S.C. 154(b) by 0 days.

(21) Appl. No.: 16/893,729

(22) Filed: Jun. 5, 2020

(65) Prior Publication Data

US 2020/0391609 A1   Dec. 17, 2020

(30) Foreign Application Priority Data

Jun. 17, 2019   (IT) .......................... 102019000009234

(51) Int. Cl.
*B60L 58/10*  (2019.01)
*B60L 50/60*  (2019.01)
*H02J 7/00*   (2006.01)

(52) U.S. Cl.
CPC .............. *B60L 58/10* (2019.02); *B60L 50/66* (2019.02); *H02J 7/0013* (2013.01); *H02J 7/0047* (2013.01)

(58) Field of Classification Search
CPC ........ B60L 58/10; B60L 50/66; H02J 7/0013; H02J 7/0047

USPC ........................................................ 320/109
See application file for complete search history.

(56) References Cited

U.S. PATENT DOCUMENTS

| 8,103,401 | B2 | 1/2012 | Kubo et al. | |
| 11,079,442 | B2* | 8/2021 | Pennisi et al. | B60L 58/22 |
| 2005/0242980 | A1 | 11/2005 | Collins et al. | |
| 2008/0272739 | A1 | 11/2008 | Carrier et al. | |
| 2010/0134068 | A1 | 6/2010 | Lim | |
| 2012/0206105 | A1 | 8/2012 | Nishizawa et al. | |
| 2013/0026994 | A1 | 1/2013 | Morikawa | |
| 2013/0093383 | A1 | 4/2013 | Kim et al. | |
| 2014/0225622 | A1 | 8/2014 | Kudo et al. | |
| 2014/0253135 | A1 | 9/2014 | Eguchi et al. | |
| 2014/0306662 | A1 | 10/2014 | Kim et al. | |
| 2017/0126035 | A1 | 5/2017 | Tosch et al. | |
| 2017/0184678 | A1 | 6/2017 | Sekiguchi et al. | |
| 2017/0254854 | A1 | 9/2017 | Honda | |

(Continued)

FOREIGN PATENT DOCUMENTS

| EP | 2787594 A2 | 10/2014 |
| WO | 2018128257 A1 | 7/2018 |

*Primary Examiner* — Sun J Lin
(74) *Attorney, Agent, or Firm* — Slater Matsil, LLP (57) ABSTRACT

A method of operating a battery management system is disclosed. A first voltage drop is sensed between a first terminal of a first battery cell and a second terminal of the first battery cell and a second voltage drop is sensed between a charge distribution pin and the second terminal of the first battery cell. The charge distribution pin is coupled to the first terminal of the first battery cell through a resistor. A difference is calculated between the first voltage drop and the second voltage drop and a faulty condition is detected when Rn absolute value of the difference between the first voltage drop and the second voltage drop exceeds a threshold.

19 Claims, 6 Drawing Sheets

(56) References Cited

U.S. PATENT DOCUMENTS

2018/0149689 A1   5/2018  Ollitrault et al.
2019/0339335 A1  11/2019  Kim et al.
2019/0366849 A1  12/2019  Pennisi et al.
2019/0372178 A1  12/2019  Pennisi et al.

* cited by examiner

METHOD OF OPERATING BATTERY MANAGEMENT SYSTEMS, CORRESPONDING DEVICE AND VEHICLE

CROSS-REFERENCE TO RELATED APPLICATIONS

This application claims priority to Italian Patent Application No. 102019000009234, filed on Jun. 17, 2019, which application is hereby incorporated herein by reference.

This application is related to U.S. patent application Ser. No. 16/420,875, filed on May 23, 2019 and claiming priority to IT 102018000005810 (filed May 29, 2018); U.S. patent application Ser. No. 16/420,992, filed on May 23, 2019 and claiming priority to IT 102018000005828 (filed May 29, 2018); and U.S. patent application Ser. No. 16/893,771, filed on Jun. 5, 2020 and claiming priority to IT 102019000009237 (filed Jun. 17, 2019). Each of these co-pending applications is incorporated herein by reference.

TECHNICAL FIELD

Embodiments relate to a method of operating battery management systems.

BACKGROUND

The evolving technology of electric vehicles (EVs) and hybrid electric vehicles (HEVs) makes improved performance of battery management systems (BMS) a desirable feature in order to facilitate safe, reliable and cost-efficient battery operation.

A task of a battery management system (BMS) involves measuring the battery cells' voltage. This in turn involves extracting relatively small voltages from comparatively high common mode voltages.

Additionally, it is noted that, for instance in automotive applications, the electric motor of the vehicle and its associated driver circuitry may be the source of noise in the form of currents injected into the battery cells or as a voltage drops across these cells. These may represent a source of electromagnetic interference over a wide range of frequencies with possible undesired effects on functional measurements.

Lack of accuracy in these measurements may adversely affect battery pack longevity and performance.

Accuracy may be pursued by placing differential voltage amplifiers with a high common-mode rejection ratio (CMRR) at each cell to provide a voltage level shift (that is, translated signals) available to be digitized by an analog-to-digital converter (ADC). Such a stage can be equipped with a number of other features such as protection and diagnostics (open load detection, leakage detection, built-in self-test or BIST, for instance). Such features are highly desirable in the automotive sector in order to facilitate complying with safety specifications.

SUMMARY

The description relates to battery management systems. One or more embodiments can be applied in the automotive field, for instance to electric vehicles and/or hybrid electric vehicles.

One or more embodiments can contribute in providing improved solutions overcoming the drawbacks discussed in the foregoing.

One or more embodiments may relate to a corresponding device, for instance a battery management system or BMS.

One or more embodiments may relate to a vehicle (for instance, a motor vehicle such as an EV or a HEV) equipped with such a device.

One or more embodiments may provide a built-is self-test (BIST) solution wherein two ADCs converting a same cell voltage are compared.

In one or more embodiments, as a result of BIST operation being enabled, a logic stage can manage analog switches to compare two codes.

In one or more embodiments, as a result of a difference between the two being found to be in excess of a certain threshold, a flag can be set.

In one or more embodiments, such a check may provide a result useful in checking the whole of the signal processing chain involved in the conversion of the signal sensed.

One or more embodiments may facilitate testing ADCs in their functional mode, by possibly checking also accuracy.

One or more embodiments may facilitate saving semiconductor area.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Further information can be found in Italian patent applications 102018000005810 (U.S. counter-part publication 2019/0366849) and 102018000005828 (U.S. counter-part publication 2019/0372178), which are exemplary of activity in this area. These applications are incorporated by reference herein.

Figure 1A:
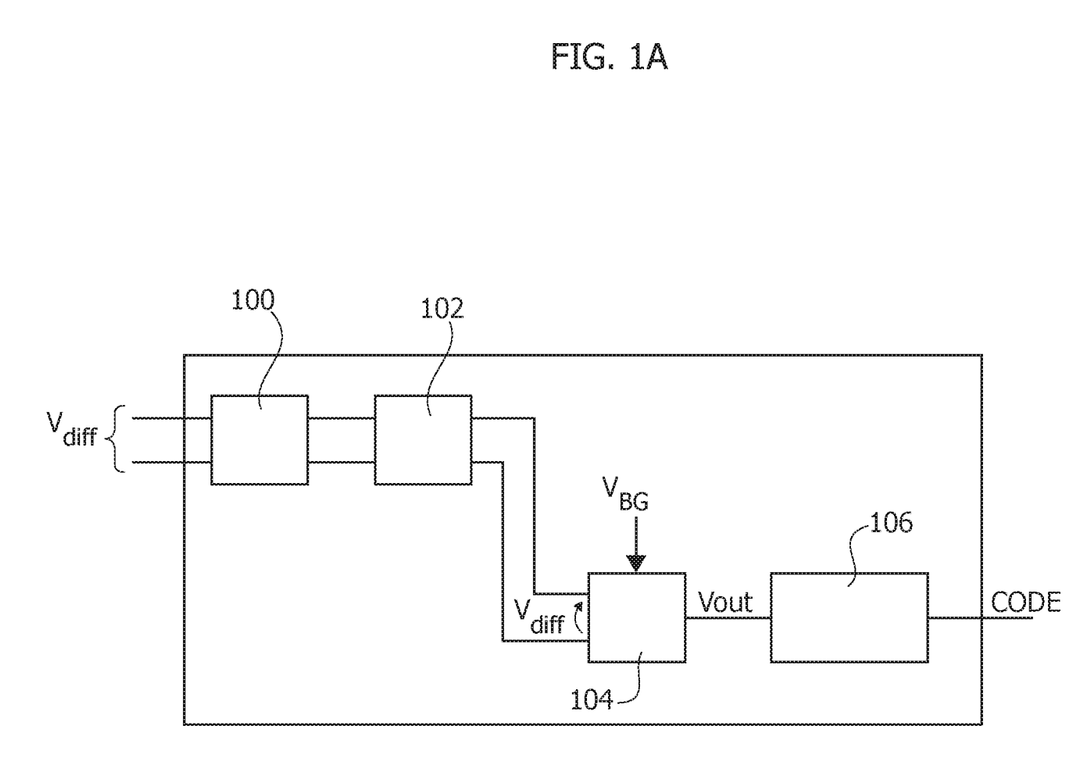
FIG. 1A is a block diagram of an exemplary arrangement for sensing differential signals.

FIG. 1A is a block diagram of an exemplary arrangement for sensing differential signals $V_{diff}$ as provided, for instance, by a high voltage differential input source. As discussed in the following, this may a cell in a battery pack equipping an electric vehicle (EVs) or a hybrid electric vehicle (HEVs) provided with a battery management system (BMS) configured to measure the battery cells' voltage, which involves extracting a relatively small (differential) voltage from a comparatively high common mode voltage.

A related sensing arrangement as exemplified in FIG. 1A may include a multiplexer 100 configured to receive the voltage $V_{diff}$ and having cascaded thereto a voltage level shifter circuit 102 which in turn feeds the (level shifted) voltage $V_{diff}$ to an analog-to-digital converter (ADC) 104.

The output voltage $V_{out}$ from the ADC 104 (which receives a reference voltage $V_{BG}$) is passed on to a digital filter 106 which outputs a digital signal CODE indicative of the value of $V_{diff}$.

As discussed, a built-in self-test or BIST feature of such an arrangement is highly desirable in the automotive sector in order to facilitate complying with safety specifications.

For that purpose, solutions have been devised capable of checking (only) the digital portion of the processing path (on the left of FIG. 1A) or the whole processing chain by using a (e.g., Zener) reference input voltage.

This latter approach may involve disconnecting the cell terminal input and connecting a precision Zener reference as an input to verify the integrity of the multiplexer, the lever shifting differential amplifier and the digital filter.

An inherent drawback of such an approach may lie in its ability being limited to emulating only a point (that is a certain value) of the differential input voltage: for instance, the output voltage from lithium cells may have a functional range of 0 to 5 V, so that only an extreme point (for instance) of the related characteristic can be verified.

Figure 1B:
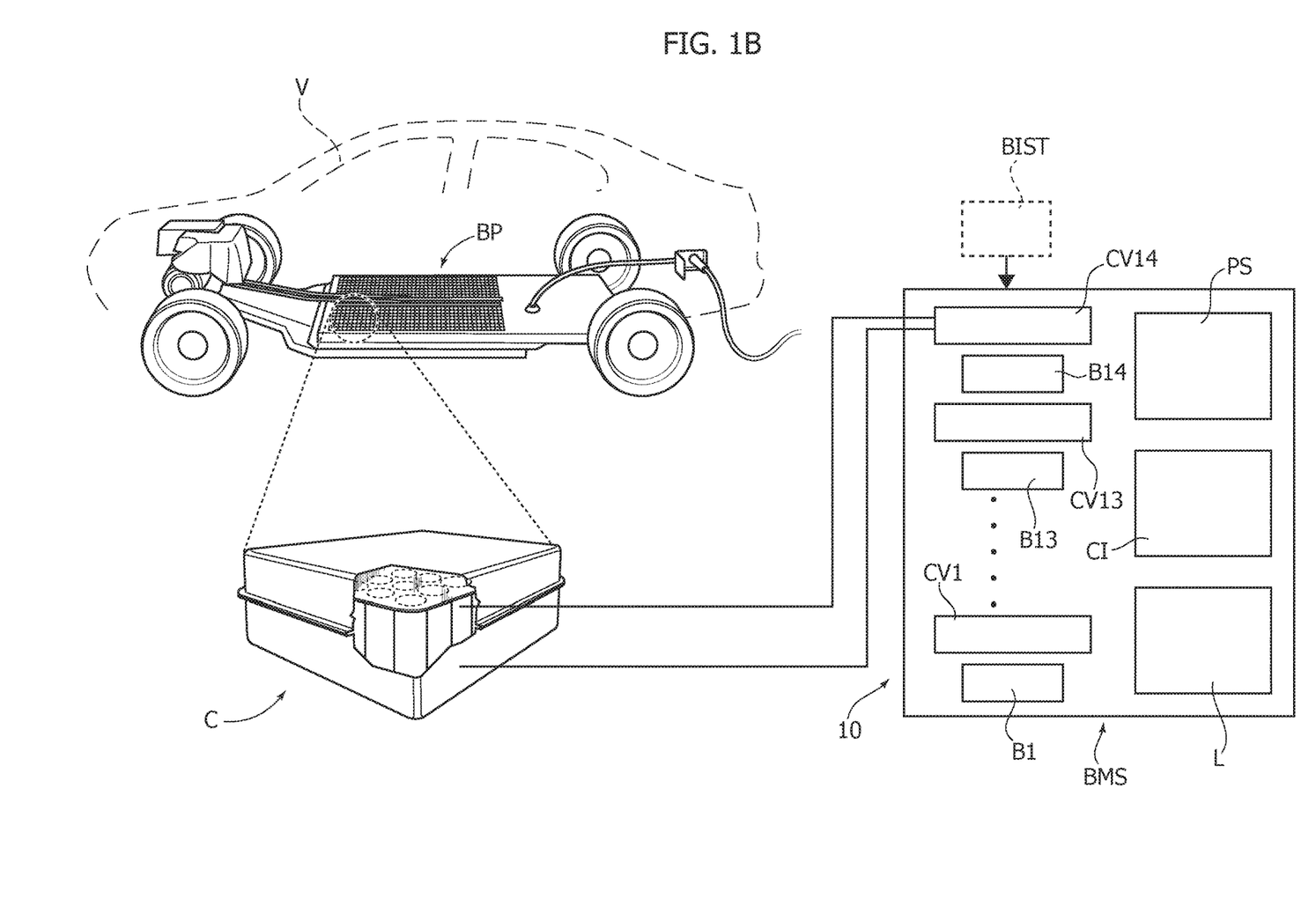
FIG. 1B is a block diagram exemplary of a possible context of use of embodiments.

FIG. 1B is exemplary of a possible arrangement of a battery pack BP equipping a vehicle V such as an electric vehicle (EV) or a hybrid electric vehicle (HEV) with an associated battery management system BMS. A lithium battery pack may be exemplary of such a battery pack.

Reference to such a possible area of application and/or to such battery technology is not however to be understood in a limiting sense of embodiments.

In one or more embodiments as exemplified herein, the battery management system BMS may comprise a device 10 (for instance an integrated circuit IC) providing various features desirable in performing battery management, for instance with a (single) device 10 configured to monitor from 4 up to 14 cells C.

In one or more embodiments, the device 10 can be configured to co-operate with a power supply PS (which may be derived from the very battery pack BP monitored by the device 10), a communication interface CI and logic circuitry L.

The device 10 may also generate stable internal references, for instance by means of a voltage regulator and bootstrap circuit. Also, it may comprise bandgaps monitored by internal circuitry to facilitate measurement accuracy.

A task of the device 10 may comprise monitoring cell and battery pack status through stack voltage measurement and cell voltage measurement. The related measurement and diagnostic tasks can be executed either on demand or periodically, for instance with a programmable cycle interval.

Measurement data may be made available for an external controller to perform a charge balancing and to compute data indicative of the State of Health (SOH) and State of a Charge (SOC) of the cells/battery pack.

In a normal operating mode, the device 10 may perform measurement conversions, diagnostics and communication tasks. Optionally, the device 10 can be set to a cyclic wake up state, thus reducing current consumption (for instance as absorbed from the battery pack BP). While in the cyclic wake up state, the main functions of the device 10 are activated periodically.

The device available with the trade designation L9963 with companies of the STMicroelectronics Group may be exemplary of a conventional arrangement for such a device 10.

In one or more embodiments, a device 10 as exemplified herein may comprise a set of converters CV1, . . . , CV14 as well as balance circuit blocks B1, . . . , B14 associated to respective cells C in the battery pack BP.

For instance, the circuit blocks B, . . . , B14 can provide (passive) cell balancing via internal discharge paths. This action aims at balancing cells in order to facilitate an equalized charge distribution over all the cells. This is found to improve performance of the battery pack BP.

A device 10 as exemplified herein can be configured to perform automatic "validation" of failure events involving the individual cells C, or the whole battery pack BP.

The related tests can be performed automatically, for instance in the case of a failure detected involving either a cell C or the battery pack BP. This facilitates providing reliable information (for instance via the communication interface, CI) to an external microcontroller supervising operation of the battery management system BMS.

In one or more embodiments the logic block L exemplified in FIG. 1 may comprise such a microcontroller.

A device 10 as exemplified herein may comprise (for instance at the converters CV1, . . . , CV14) Built-In Self Test (BIST) circuitry configured to facilitate a correct operation of internal elements such as analog comparators and analog-to-digital converters (ADCs).

A circuit 10 as exemplified herein may comprise at least some of the features of a BIST circuit as disclosed in U.S. publication 2019/0366849 and U.S. publication 2019/0372178, which are incorporated by reference herein.

The representation provided in FIG. 1 is a general functional description of the device 10.

More in detail, a device 10 as exemplified herein (see, for instance, FIG. 2) may comprise charge-sensing pins Cn, namely C0, C1, . . . , C14, in the case exemplified herein. The charge-sensing pins Cn are coupled to the cells C in the battery pack BP, with, for instance, an n-th cell, Celln, arranged between the pins Cn and Cn−1.

As exemplified herein (see again, for instance, FIG. 2) a first cell Cell1 is shown arranged between the pins C0 and C1 and so on up to the cell Cell14 arranged between the pins C13 and C14.

Figure 2:
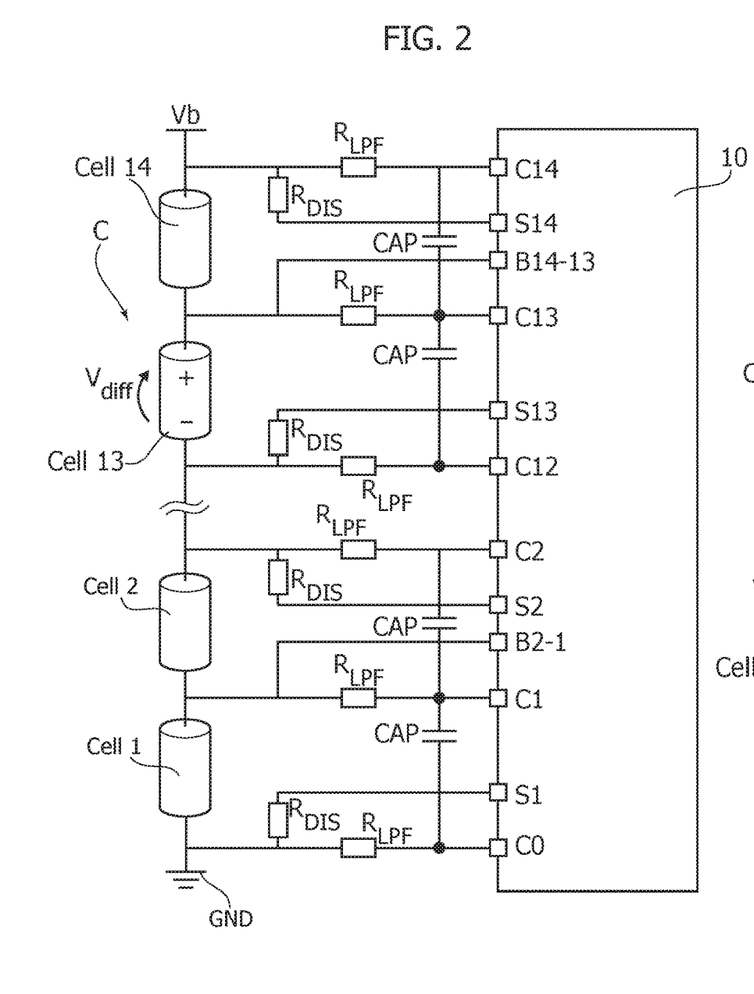
FIG. 2 is a block diagram exemplary of a device to which embodiments may apply.

For the sake of simplicity, the various cells can be considered as identical. Each of them may thus have a resistor $R_{LPF}$, arranged coupling the pins C0, . . . , C14, to respective ends of the cells Cell1, . . . , Cell14 and a capacitor CAP between adjacent pins.

The resistors $R_{LPF}$ and the capacitors CAP provide respective low-pass RC filters, which facilitate filtering out unwanted signals at the battery terminals.

In one or more embodiments the pins C0, . . . , C14 of the device 10 can be regarded as high-impedance nodes so that no appreciable voltage drop may be assumed to occur across the resistors $R_{LPF}$.

Consequently, a (differential) voltage $V_{diff}$ substantially corresponding to the voltage across the n-th cell Celln may be assumed to be available for "reading" between adjacent pins Cn−1 and Cn.

In one or more embodiments, further pins designated Sn (n=1, . . . , 14) as well as pins Bn_n−1 (with N=2, . . . , 14 in the case exemplified herein) may be used for balance purposes, namely for discharging cells which are detected to be "too charged" in order to equalize the distribution of charge over all the cells.

The amount of the (balance) discharge current may be set by resistors $R_{DLS}$ coupling the "even numbered" S pins, namely S2, . . . , S14 to the "upper" end (namely the end or node towards the overall voltage Vb of the battery pack), and the "odd numbered" S pins, namely S1, . . . , S13 to the "lower" end or node (opposite the battery pack voltage VB, that is towards ground GND) of the corresponding cell.

The pins Bn_n−1 are (directly) coupled between the resistors $R_{LPF}$ and the corresponding ends of the cells Cell1, . . . , Cell14 where no discharge resistor $R_{DIS}$ are provided.

Figure 3:
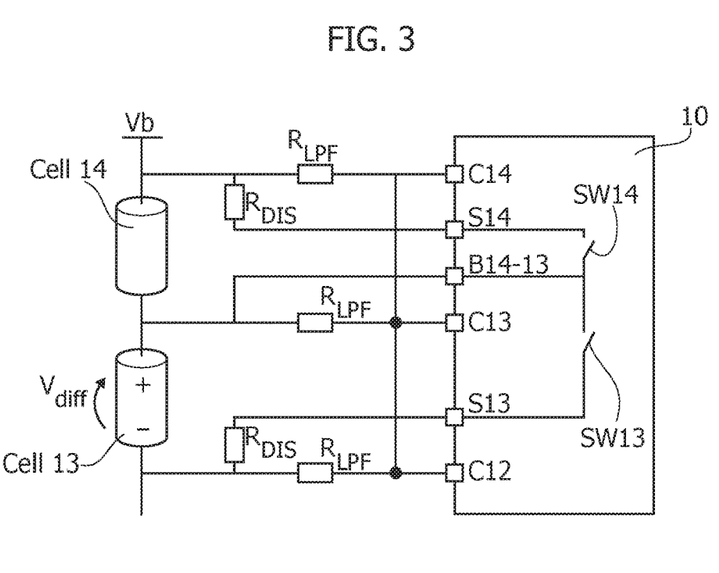
FIG. 3 is a circuit diagram exemplary of a portion of the device of FIG. 2, FIGS. 4 and 5 are diagrams exemplary of structure and operation of embodiments.

FIG. 3 details by way of simplicity the arrangement discussed in the foregoing with reference to the two "uppermost" cells in the battery pack BP exemplified herein, namely Cell14 and a Cell13 by showing the corresponding coupling of the pins C12, C13, C14, S13, S14, and B14-13 of the device 10. The associated capacitors CAP shown in FIG. 2 are not reproduced in FIG. 3 for simplicity).

The device 10 as exemplified herein may thus be considered to comprise a plurality of charge-sensing pins C0 to C14 which can be regarded as arranged in an ordered (numbered) sequence of pins C0 to C14, for instance starting from ground GND to the "upper" voltage Vb node or bar of the battery pack BP, with these charge-sensing pins comprising even-numbered pins (C0, C2, C4, . . . , C14) interleaved with odd-numbered pins (C1, C3, . . . , C13).

Also, the pins C0 to C14 can be seen as comprising a plurality of pairs of charge-sensing pins, namely C0, C1; C1, C2; . . . ; C12, C13; C13, C14 arranged in an ordered sequence of:

those pairs of charge-sensing pins that are in odd-numbered positions (1, 3, 5, 7, 9, 11, 13) in the ordered sequence (from ground GND to Vb) of charge-sensing pins C1 to C14 exemplified herein, namely:
C0, C1;
C2, C3;
C4, C5;
C6, C7;
C8, C9;
C10, C11;
C12, C13; and
those pairs of charge-sensing pins that are in even-numbered positions (2, 4, 6, 8, 10, 12, 14) in the ordered sequence (from ground GND to Vb) of charge-sensing pins C1 to C14 exemplified herein, namely:
C1, C2;
C3, C4;
C5, C6;
C7, C8;
C9, C10;
C11, C12;
C13, C14.

The charge sensing pins in the pairs of charge-sensing pins in the plurality of pairs (C0, C1; C1, C2; . . . ; C12, C13; C13, C14) of charge-sensing pins are coupled via a coupling resistor ($R_{LPF}$) to a respective cell (Cell1, Cell2, . . . , Cell13, Cell14) in the battery pack BP to sense the voltage across said respective cell.

Also, each odd-numbered (C0, C1; . . . ; C12, C13) resp. even-numbered (C1, C2; . . . ; C13, C14) pair of charge-sensing pins shares a common charge sensing pin (C1, . . . , C13) with the subsequent even-numbered pair (C1, C2; . . . ; C13, C14) resp. previous odd-numbered pair (C0, C1; . . . ; C12, C13) of charge-sensing pins in the ordered sequence of odd- and even-numbered pairs of charge-sensing pins.

For instance, as seen in FIG. 3:
the odd-numbered pair C12, C13 of charge-sensing pins shares a common charge sensing pin, namely C13, with the subsequent even-numbered pair C13, C14 in the ordered sequence of charge sensing pins, and, likewise
the even-numbered pair C13, C14 of charge-sensing pins shares a common charge sensing pin, again C13, with the previous odd-numbered pair C12, C13 in the ordered sequence of charge sensing pins.

Also, the charge distribution pins as exemplified herein can be regarded as comprising first charge distribution pins S1, . . . , S14 and second charge distribution pins B2-1, . . . , B14-13.

By again referring to FIG. 3, one may further note that, in a device 10 as exemplified herein, each odd-numbered pair of charge-sensing pins (C12, C13, in the case of FIG. 3) and the subsequent even-numbered pair (C13, C14, in the case of FIG. 3) of charge-sensing pins in said ordered sequence of odd- and even-numbered pairs of charge-sensing pins comprise:

a) an odd-numbered first charge distribution pin (S13, in the case of FIG. 3) coupled via a discharge resistor $R_{DIS}$ to the charge sensing pin (C12, in the case of FIG. 3) of the odd-numbered pair (C12, C13, in the case of FIG. 3) of charge-sensing pins other than the common charge sensing pin (C13, in the case of FIG. 3), b) an even-numbered first charge distribution pin (S14, in the case of FIG. 3) coupled via a discharge resistor $R_{DIS}$ to the charge sensing pin (C14, in the case of FIG. 3) of the even-numbered pair (C13, C4, in the case of FIG. 3) of charge-sensing pins other than the common charge sensing pin (C13, in the case of FIG. 3), c) a second charge distribution pin (B14-13, in the case of FIG. 3) coupled via a charge sensing resistor $R_{LPF}$ to the common charge sensing pin (C13, in the case of FIG. 3), the second charge distribution pin (here B14-13) configured to be selectively coupled via switches SW13, SW14 to the odd-numbered first charge distribution pin (S13, in the case of FIG. 3) and the even-numbered first charge distribution pin (S14, in the case of FIG. 3) to exchange electrical charge therewith in order to perform a charge balance function.

As represented for the sake of simplicity (only) in FIG. 3, when the balance function is activated on a specific cell, an associated switch is activated to discharge the cell with a current whose intensity I is given by the ratio $V_{diff}/R_{DIS}$. Two such switches (SW13 or SW14 in FIG. 3, which may be implemented as electronic switches such as a MOSFET transistor) are shown in FIG. 3 as associated with the cells Cell13 and Cell14. A similar arrangement (not visible in the figures for simplicity) may apply to the other cells in the battery pack BP.

As discussed previously, $R_{LPF}$ and CAP define the pole (that is, the cut-off or corner frequency) of the low-pass charge-sensing filter, while the resistance value of the resistors Rocs defines the discharge cell current for balance purposes.

It will be appreciated that, while exemplified herein with reference to FIG. 3, where only the two cells Cell13 and Cell14 are visible, the arrangement discussed in the foregoing can be reproduced for all of the odd-numbered and even-numbered charge pin pairs in the device 10.

The ability of checking the integrity, and possibly the accuracy, of a whole processing chain (as exemplified in FIG. 1A, for instance) involved in sensing the differential voltages $V_{diff}$ at the cells Cell1, . . . , Cell 14 is a highly desirable feature, for instance in the automotive sector, in order to facilitate complying with safety specifications.

As discussed, certain solutions have been devised capable of checking (only) the digital portion of the processing path or the whole processing chain (only) at a certain point of the related characteristic.

One or more embodiments as exemplified in the following in connection with FIGS. 4 to 6 may overcome those limitations taking advantage of the presence of the charge distribution pins Sn already provided for balance purposes, that is in order to discharge cells that are over-charged in order to facilitate an equalized distribution of electrical charge over the various cells, which is found to improve battery pack performance.

One or more embodiments may facilitate performing a single measurement of a same cell exploiting two (different) ADC's.

While in principle those two measurements should be equal, it is noted that a difference between the two measurements may arise, for instance, as a result of a failure (possibly including an undesired variation in a reference bandgap) in either one of the two ADCs involved. This difference can be compared against a threshold and, as a result of the threshold being found to be exceeded, an error BIST flag can be raised.

Figure 4:
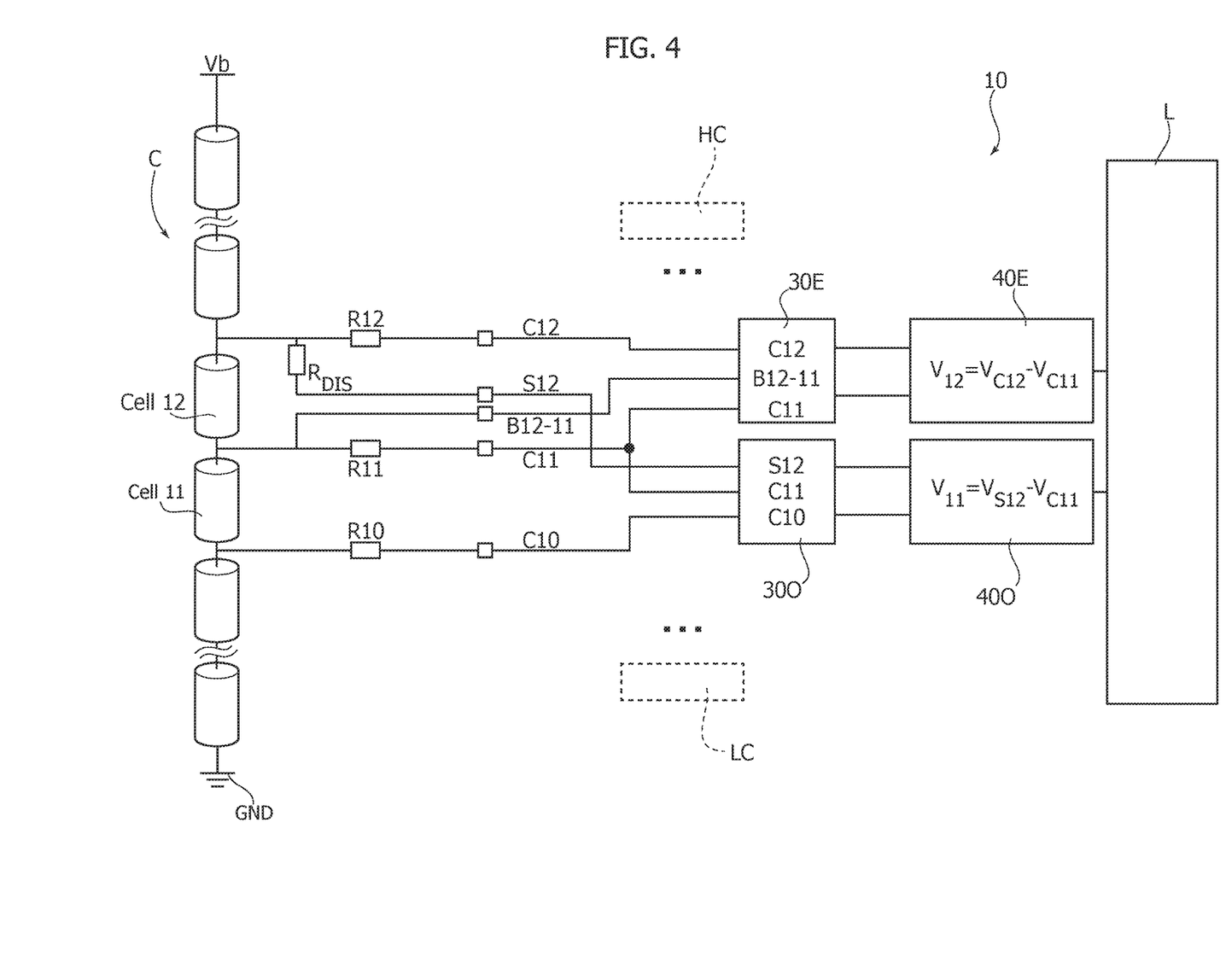

This type of operation can be implemented (with moderate efforts in terms of logic circuitry and with virtually no penalty in terms of semiconductor area) by exploiting switching, multiplexer and ADC circuitry as exemplified in FIG. 4, which may be compatible with an open load and cell measurement arrangement as disclosed in Italian patent application 102018000005828, already repeatedly cited.

For the sake of simplicity, FIG. 4 refers to only two cells of the plurality of cells C, namely Cell11 (coupled between the odd-numbered pair of pins C10 and C11), and Cell12 (coupled between the even-numbered pair of pins C11 and C12).

It will be otherwise understood that these two cells may be regarded as lying between a set of "lower" cells LC, namely Cell1 to Cell10 and a set of "higher" cells HC, namely Cell13 and Cell14.

As exemplified in FIG. 4 the "odd-numbered" cells (Cell11 being exemplary of these) are shown coupled with a cascaded arrangement of a multiplexer 30O (30-Odd) and an analog-to-digital converter (ADC) 40O (40-Odd).

Similarly, the "even-numbered" cells (Cell12 being exemplary of these) are shown coupled with a cascaded arrangement of a multiplexer 30E (30-Even) and an analog-to-digital converter (ADC) 40E (40-Even).

For the sake of simplicity, only the multiplexer and the analog-to-digital converter (ADC) of a processing chain as exemplified in FIG. 1A are visible in FIG. 4: both the voltage level shifter block and the digital filter of FIG. 1A can be considered as incorporated to other blocks in FIG. 4. Just to make an example, a level shifter can be regarded as embedded in an analog front end of the ADC.

It will be otherwise appreciated that—while illustrated as individual distinct elements for the sake of simplicity and ease of understanding—the various components 30O, 40O, and 30E, 40E may incorporated to single combined components.

In one or more embodiments, the multiplexers 30O, 30E may comprise three input lines and two output lines.

In one or more embodiments, the multiplexers 30O, 30E can be configured to apply to the inputs of the corresponding ADC's 40O, 40E the (voltage) signals sensed across the respective cell.

For instance the multiplexer 30O may be configured—during normal operation—to have applied to its input pins C10, C11 the voltage sensed across the Cell11 (via resistors R10, R11, exemplary of corresponding resistors $R_{LPF}$—again, the associated capacitors CAP are not visible for simplicity), while the multiplexer 30E may be configured to have applied to its input pins C11, C12 the voltage sensed across the Cell12 (via resistors R11, R12 exemplary of corresponding resistors $R_{LPF}$— once more, the associated capacitors CAP are not visible for simplicity).

As exemplified in FIG. 4, in one or more embodiments, the multiplexers 30O (odd-numbered cells) and 30E (even-numbered cells) may be coupled in such a way that, in each pair of an odd-numbered cell (here Cell11) and an even-numbered cell (here Cell12), the "odd-numbered" multiplexer 30O is also coupled to the "S" pin (here, pin S12) of the even-numbered cell while the "even-numbered" current multiplexer 30E is also coupled to the Bn_n−1 pin (here B12_11) coupled between the two cells in the pair (here Cell11 and Cell12).

Figure 6:
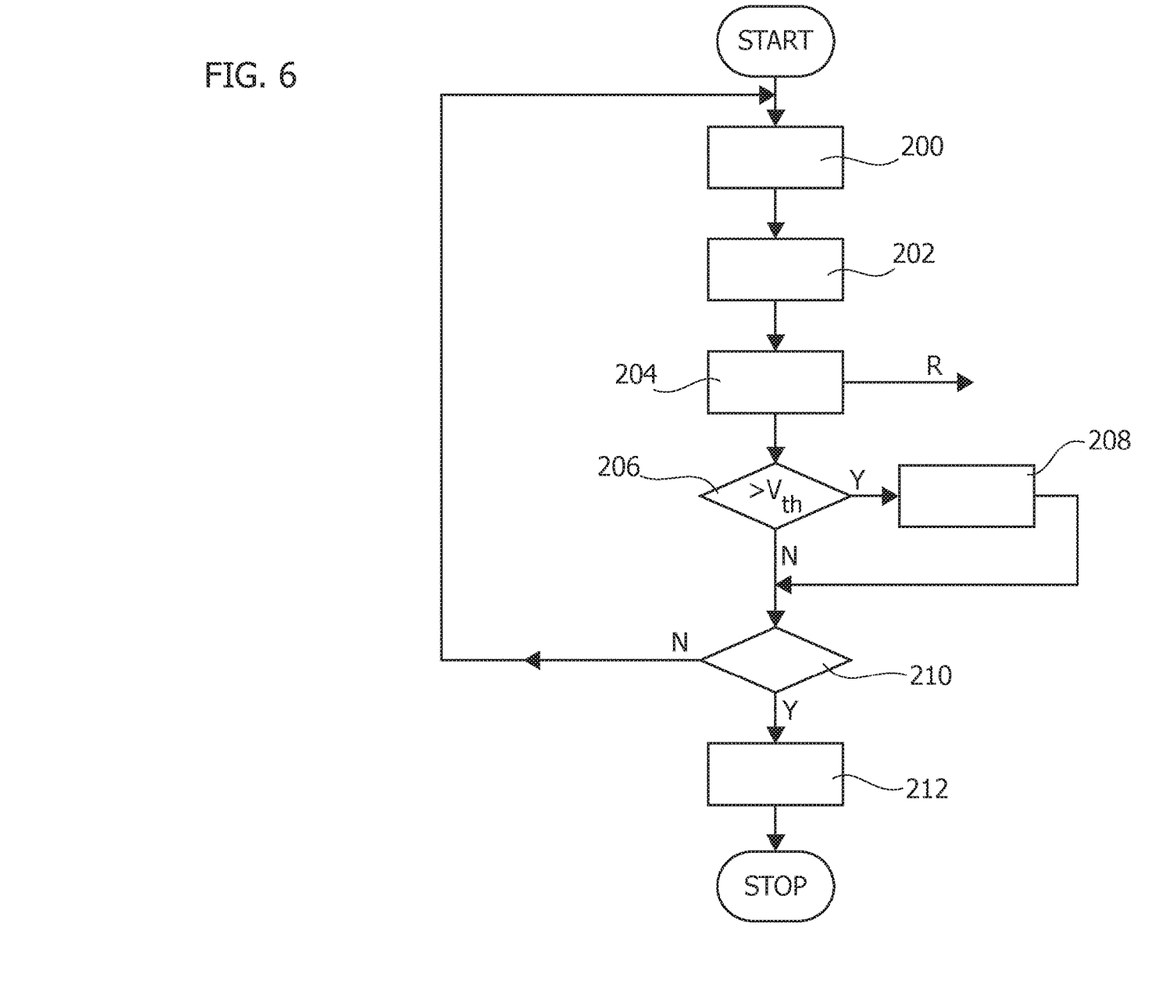
FIG. 6 is a flow chart exemplary of possible operation in embodiments.

The flowchart of FIG. 6 is exemplary of possible acts in a built-in self-test (BIST) process which, in one or more embodiments, can be performed in an automated way under the control of the logic circuit L.

After START, in an act as exemplified by block 200, the multiplexers 30E, 30O are controlled by the logic circuit L in such a way that the (voltage) signals at pins C12 and C11, namely $V_{C12}$ and $V_{C11}$ are applied to the even-numbered ADC 40E; and the (voltage) signals at pins S12 and C11, namely $V_{S12}$ and $V_{C11}$, are applied to the odd-numbered ADC 40O.

Conversion, performed in a manner known per se in an act 202 in the converters 40E, 40O (for instance sigma-delta ADC converters) will result in a first differential signal $V_i = V_{C12} - V_{C11}$ (that is, a digital signal corresponding to the difference of the signals at C12 and C11) and a second differential signal $V_{11} - V_{S12} - V_{C11}$ (that is, a digital signal corresponding to the difference of the signals at S12 and C11) applied to the logic circuit L (in any known manner).

In one or more embodiments, in an act indicated by block 204, the absolute value (or modulus) abs($V_{12} - V_{11}$) of the difference $V_{12} - V_{11}$—that is the absolute value of ($V_{C12} - V_{C11}$) − ($V_{S12} - V_{C11}$)—is calculated in the logic circuit L.

In view of the connections exemplified in FIG. 4—and assuming otherwise correct operation (that is no open-load or leakage), such a difference may be expected to be notionally null, due to the signals $V_{C12}$ and $V_{S12}$ being sourced from the same sensing pin via $R_{12}$ and $R_{DIS}$ with a negligible voltage drop across these resistors.

In an act 206, the value abs($V_{11} - V_{12}$) calculated at the act 204 can be compared with a threshold Vth corresponding to an acceptable nominal difference in operation of the $V_{diff}$ sensing chains (primarily the ADCs) associated with the cells considered (here Cell11 and Cell12, by way of example).

If the comparison in the act 206 yields a positive outcome (Y=the value abs($V_{11} - V_{12}$) is in excess of Vth) a BIST error flag (BIST_error_ADCx, with x the number of the ADCs involved, for instance) can be set in an act 208 for both these sensing chains so that adequate action can be taken (an alarm signal issued, for instance).

If the comparison in the act 206 yields a negative outcome (N=the value abs($V_{11}$-$V_{12}$) is below Vth) both sensing chains can be held to operate adequately and in an act 210 a check can be made as to whether all the pairs of cells/sensing chains have been tested.

As a result of the act 210 yielding a negative outcome, the acts 200 to 206 can be repeated (possibly simultaneously, that is at a same time, in parallel) for all the pairs of cells/sensing chains in the system, with BIST error flags possibly set in an act such as 208 as a result of inadequate operation detected.

As a result of the act 210 yielding a positive outcome, indicative that all the pairs of cells/sensing chains have been tested, the procedure may evolve to a STOP, to be possibly repeated from START, for instance after a certain waiting time or as a result of a positive command signal received (for instance, this may correspond to a reset signal indicative of the fault having been dispensed with, e.g. due to a service intervention).

One or more embodiments may offer the advantage of correct operation (of ADCs, for instance) being checked in functional conditions and setup. In fact, in one or more embodiments, the voltage sensing chains are tested converting the same voltages that they convert in functional mode.

This advantage may be appreciated by considering that a system as exemplified herein may operate with battery packs having different operating values for the cells, with values ranging between 1.7V and 4.7V for instance.

Another advantage may lie in the fact that the difference $V_{12}$-$V_{11}$ and/or the absolute value (modulus) abs($V_{12}$-$V_{11}$) calculated at 202 or 204 may be indicative of the resolution of the ADCs involved, with the value of such resolution possibly made available as exemplified by R in FIG. 6 (block 204).

Figure 5:
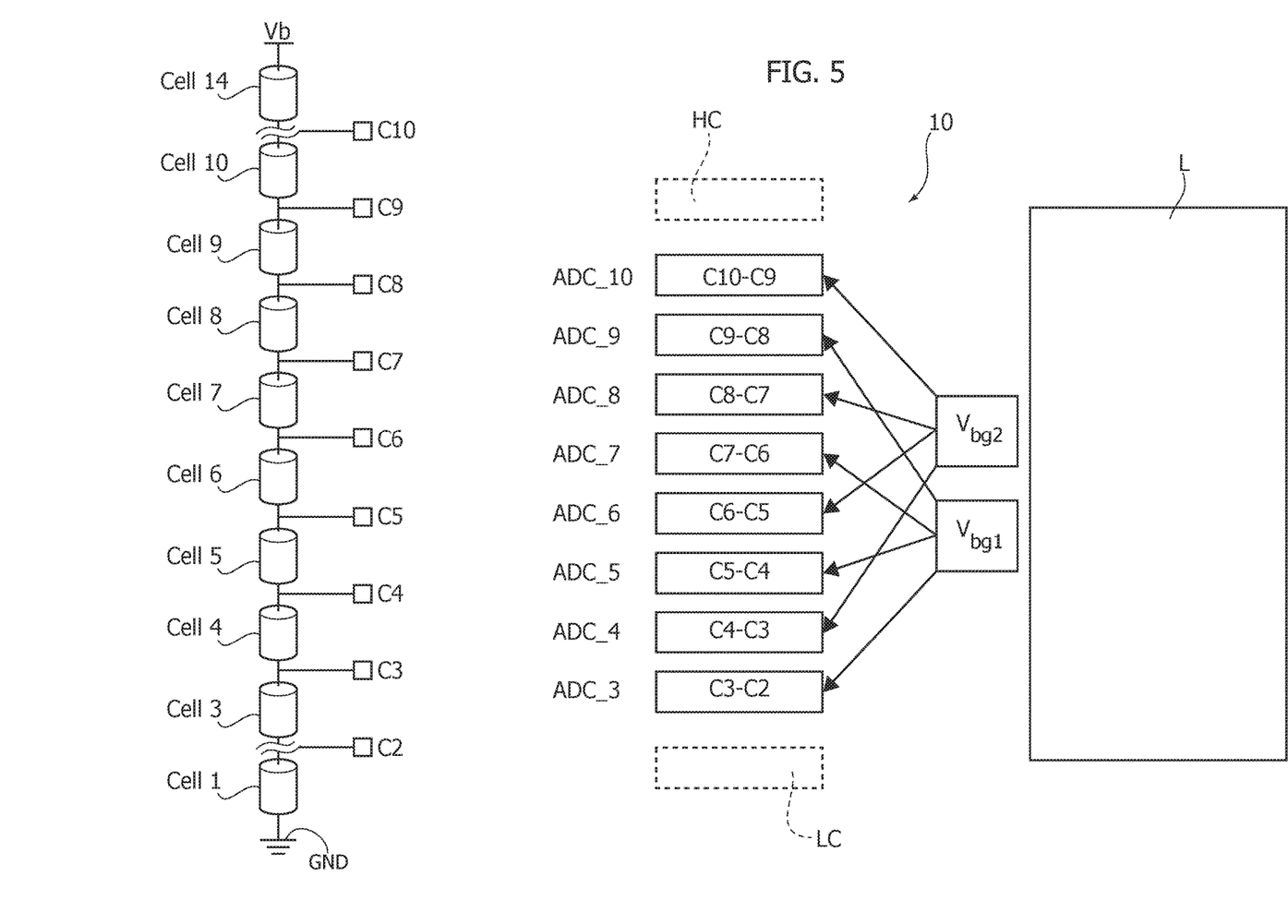

FIG. 5 (where cells such as Cell2 and Cell11, Cell12 and Cell13 are not visible for compactness) is also exemplary of the possibility for "adjacent" ADCs such as 40O and 40E in FIG. 4 (as indicated for simplicity by subsequent numbers, namely ADC_3, ADC_4, . . . , ADC_10) to use reference voltages (see $V_{BG}$ in FIG. 1A), $V_{bg1}$ and $V_{bg2}$, which (even though expected to have a same value) can be produced—in a manner known to those of skill in the art—to be (completely) independent from each other.

A discrepancy or a drift between bandgap references may thus be detected thanks to this feature. In fact, such a discrepancy or drift will result in different output codes from adjacent ADCs (see CODE in FIG. 1A). This may be detected as a result of the comparison act 206 with an error flag (BIST_error_ADCx, with x the number of the ADC involved) set for all ADCs involved (block 208 in FIG. 6).

One or more embodiments may thus rely on internal charge transfer paths (already) provided for balancing the cells in a battery pack in order to facilitate charge equalization between the cells.

One or more embodiments may provide a built-in self-test (BIST) feature the verifies the adequate functionality of the $V_{diff}$ sensing chains (internal analog comparators and ADCs, for instance) with a check procedure which can be automatically performed in case of a failure of either one of two cells or a battery pack as a whole, with the capability of providing corresponding (reliable) information—to an external microcontroller, for instance.

A method as described herein facilitates operating a control device (for instance, 10) in a battery management system (for instance, BMS). The control device may comprise an ordered sequence of charge-sensing pins (for instance, C0 to C14) arranged in a plurality of pairs (for instance, C0, C1; C1, C2; . . . ; and C12, C13; C13, C14) of charge-sensing pins in an ordered sequence of odd- and even-numbered pairs of charge-sensing pins, the charge sensing pins in each pair of charge-sensing pins in said plurality of pairs of charge-sensing pins coupled (for instance, $R_{LPF}$) to a respective cell (for instance, Cell1, Cell2, . . . , Cell13, Cell14) in a battery pack to sense the voltage across said respective cell, wherein each odd-numbered (for instance, C0, C1; . . . ; C12, C13) resp. even-numbered (for instance, C1, C2; . . . ; C13, C14) pair of charge-sensing pins shares a common charge sensing pin (for instance, C1, . . . , C13) with a subsequent even-numbered pair (for instance, C1, C2; . . . ; C13, C14) resp. a previous odd-numbered pair (for instance, C0, C1; . . . ; C12, C13) of charge-sensing pins in said ordered sequence of odd- and even-numbered pairs of charge-sensing pins.

Each odd-numbered pair (for instance, C0, C1; . . . ; C12, C13) of charge-sensing pins and the subsequent even-numbered pair (for instance, C1, C2; . . . ; C13, C14) of charge-sensing pins in said ordered sequence of odd- and even-numbered pairs of charge-sensing pins may comprise a charge distribution pin (for instance, S2, S4, . . . , S12, . . . , S14) coupled (for instance, $R_{DIS}$) to the charge sensing pin of the even-numbered pair of charge-sensing pins other than said common charge sensing pin (for instance, C1, . . . , C13).

A method as described herein may comprise, for each odd-numbered (for instance, C0, C1; . . . ; C12, C13) pair of charge-sensing pins and the subsequent even-numbered pair (for instance, C1, C2; . . . ; C13, C14) of charge-sensing pins in said ordered sequence of odd- and even-numbered pairs of charge-sensing pins a self-test procedure (for instance, 200 to 210.

In one embodiment, the test procedure comprises:
sensing (for instance, 200, 30E, 40E, 30O, 40O):
i) a first voltage drop (for instance, $V_{12}$) between the charge sensing pin (for instance, C12) of said subsequent even-numbered pair (for instance, C11, C12) other than said common charge sensing pin (for instance, C11) and said common charge sensing pin (for instance, C11),
ii) a second voltage drop (for instance, $V_{11}$) between the charge distribution pin (for instance S12) coupled (for instance, $R_{DIS}$) to the charge sensing pin of said subsequent even-numbered pair (C11, C12) other than said common charge sensing pin (C1, . . . , C13) and said common charge sensing pin (for instance, C11),
calculating (for instance, 202, L) a difference (for instance, $V_{12}$-$V_{11}$) between said first voltage drop (for instance, $V_{12}$) and said second voltage drop (for instance, $V_{11}$) sensed,
comparing (for instance, 204, 206) the absolute value (modulus) of said difference calculated (for instance, $V_{12}$-$V_{11}$) with a threshold (for instance, Vth), and
declaring (for instance, 208) a faulty condition as a result of the absolute value of said difference calculated (for instance, $V_{12}$-$V_{11}$) exceeding said threshold.

A method as described herein may comprise:
sensing said first voltage drop (for instance, $V_{12}$) and said second voltage drop (for instance, $V_{11}$) via first (for instance, 30E, 40E) and second (for instance, 30O, 40O) signal sensing circuitry, and
declaring (for instance, 208) said faulty condition for both said first (for instance, 30E, 40E) and second (for instance, 30O, 40O) signal sensing circuitry, as a result of the absolute value of said difference calculated (for instance, $V_{12}-V_{11}$) exceeding said threshold.

A method as described herein may comprise:

sensing said first voltage drop (for instance, $V_{12}$) and said second voltage drop (for instance, $V_{11}$) via first (for instance, 30E, 40E) and second (for instance, 30O, 40O) signal sensing circuitry wherein said first (for instance, 30E, 40E) and second (for instance, 30O, 40O) signal sensing circuitry have a sensing resolution, and issuing, irrespective of the absolute value of said difference calculated (for instance, $V_{12}-V_{11}$) exceeding said threshold (that is, even if such a threshold is not exceeded), a difference signal (for instance, R) which is a function of the difference calculated (for instance, $V_{11}-V_{12}$), said difference signal being indicative of said sensing resolution.

A method as described herein may comprise:

sensing said first voltage drop (for instance, $V_2$) and said second voltage drop (for instance, $V_{11}$) via first (for instance, 30E, 40E) and second (for instance, 30O, 40O) signal sensing circuitry wherein said first (for instance, 30E, 40E) and second (for instance, 30O, 40O) signal sensing circuitry comprise a first analog-to-digital converter (for instance, 40E) and a second analog-to-digital converter (for instance, 40O), respectively, applying to said first analog-to-digital converter (for instance, 40E) and second analog-to-digital converter (for instance, 40O) mutually independent reference voltages (for instance, $V_{bg1}$, $V_{bg2}$), wherein the absolute value of said difference calculated (for instance, $V_{12}-V_{11}$) exceeding said threshold is indicative of a faulty condition of said reference voltages (for instance, $V_{bg1}$, $V_{bg2}$).

In a method as described herein, said control device (for instance, 10) may be configured to operate in a normal operating mode, wherein the control device (for instance, 10) senses the voltages across said cells (for instance, Cell1, Cell2, ..., Cell13, Cell14) in said battery pack with electrical charge exchanged therebetween via said first (for instance, S1, ..., S14) and second (for instance, B2-1, ..., B14-13) charge distribution pins, A method as described herein may involve performing said self-test procedure (for instance, 200 to 210) during operation in said normal operating mode.

A control device for a battery management system as described herein may comprise:

an ordered sequence of charge-sensing pins (for instance, C0 to C14) arranged in a plurality of pairs (for instance, C0, C1; C1, C2; ...; C12, C13; C13, C14) of charge-sensing pins in an ordered sequence of odd- and even-numbered pairs of charge-sensing pins, the charge sensing pins in each pair of charge-sensing pins in said plurality of pairs (for instance, C0, C1; C1, C2; ...; C12, C13; C13, C14) of charge-sensing pins configured to be coupled (for instance, $R_{LPF}$) to a respective cell (for instance, Cell1, Cell2, ..., Cell3, Cell14) in a battery pack (for instance, BP) to sense the voltage across said respective cell, wherein each odd-numbered (for instance, C0, C1; ...; C12, C13) resp. even-numbered (for instance, C1, C2; ...; C13, C14) pair of charge-sensing pins shares a common charge sensing pin (for instance, C1, ..., C13) with the subsequent even-numbered pair (for instance, C1, C2; ...; C13, C14) resp. previous odd-numbered pair (for instance, C0, C1; ...; C12, C13) of charge-sensing pins in said ordered sequence of odd- and even-numbered pairs of charge-sensing pins, wherein each odd-numbered pair (for instance, C0, C1; ...; C12, C13) of charge-sensing pins and the subsequent even-numbered pair (for instance, C1, C2; ...; C13, C14) of charge-sensing pins in said ordered sequence of odd- and even-numbered pairs of charge-sensing pins may comprise a charge distribution pin (for instance, S2, S4, ..., S12, ..., S14) configured to be coupled (for instance, $R_{DIS}$) to the charge sensing pin of the even-numbered pair of charge-sensing pins other than said common charge sensing pin (for instance, C1, ..., C13), A device (for instance, 10) as exemplified herein may comprise a processor circuit (for instance, L) as well as signal sensing circuitry (for instance, 30E, 30O; 40E, 40A), wherein the device may be configured to be operated with the method as described herein, with:

the signal sensing circuitry (for instance, 30E, 30O; 40E, 40A) configured to sense (for instance, 200) said first and second voltage drops (for instance, $V_{11}$; $V_{12}$), the processor circuit (for instance, L) configured to calculate (for instance, 204) said difference (for instance, $V_{12}-V_{11}$) between said first voltage drop (for instance, $V_{12}$) and said second voltage drop (for instance, $V_{11}$) sensed, compare (for instance, 204, 206) the absolute value of said difference calculated (for instance, $V_{12}-V_{11}$) with a threshold, and declare (for instance, 208) said faulty condition as a result of the absolute value of said difference calculated (for instance, $V_{12}-V_{11}$) exceeding said threshold.

An electrically powered vehicle (for instance, V) as described herein may comprise a battery pack (for instance, BP) comprising a plurality of electrical battery cells (for instance, C), a battery management system (for instance, BMS) coupled to said battery pack (for instance, BP), a control device (for instance, 10) as described herein, the control device configured to control said battery management system.

In brief, one or more embodiments may offer one or more of the following advantages:

a same set of pins used for cell measurements and cell balance can be exploited for built-in self-test (BIST) purposes;

a control threshold Vth can be adopted which is variable at will;

high accuracy;

capability of operating at the actual functioning point of the cells;

possibility of using equal, yet independent references $V_{bg1}$ e $V_{bg2}$ for the converters;

capability of detecting possible reference drifts.

Without prejudice to the underlying principles, the details and embodiments may vary, even significantly, with respect to what has been described by way of example only without departing from the extent of protection.

The extent of protection is determined by the annexed claims.

What is claimed is:

1. A method of operating a control device in a battery management system, wherein the control device comprises an ordered sequence of charge-sensing pins arranged in a plurality of pairs of charge-sensing pins in an ordered sequence of odd- and even-numbered pairs of charge-sensing pins, the charge sensing pins in each pair of charge-sensing pins in the plurality of pairs of charge-sensing pins being coupled to a respective cell of cells in a battery pack to sense a voltage across the respective cell;

wherein each odd-numbered pair of charge-sensing pins shares a common charge sensing pin with a subsequent even-numbered pair of charge-sensing pins in the ordered sequence of odd- and even-numbered pairs of charge-sensing pins;

wherein each even-numbered pair of charge-sensing pins shares a common charge sensing pin with a subsequent odd-numbered pair of charge-sensing pins in the ordered sequence of odd- and even-numbered pairs of charge-sensing pins;

wherein each odd-numbered pair of charge-sensing pins and the subsequent even-numbered pair of charge-sensing pins comprise a charge distribution pin coupled to the charge sensing pin of the even-numbered pair of charge-sensing pins other than the common charge sensing pin, wherein the method comprises, for each odd-numbered pair of charge-sensing pins and the subsequent even-numbered pair of charge-sensing pins performing a self-test procedure;

wherein the self-test procedure comprises:

sensing a first voltage drop between the charge sensing pin of the subsequent even-numbered pair other than the common charge sensing pin and the common charge sensing pin, and a second voltage drop between the charge distribution pin coupled to the charge sensing pin of the subsequent even-numbered pair other than the common charge sensing pin and the common charge sensing pin;

calculating a difference between the first voltage drop and the second voltage drop sensed;

comparing an absolute value of the difference calculated with a threshold; and determining a faulty condition as a result of the absolute value of the difference calculated exceeding the threshold.

2. The method of claim 1, wherein the sensing the first voltage drop and the second voltage drop comprises sensing the first voltage drop and the second voltage drop using first signal sensing circuitry and second signal sensing circuitry; and wherein the determining the faulty condition comprises determining the faulty condition for both the first signal sensing circuitry and the second signal sensing circuitry as a result of the absolute value of the difference calculated exceeding the threshold.

3. The method of claim 1, wherein the sensing the first voltage drop and the second voltage drop comprises sensing the first voltage drop and the second voltage drop using first signal sensing circuitry and second signal sensing circuitry, each one of the first signal sensing circuitry and the second signal sensing circuitry having a sensing resolution; and the method further comprising issuing, irrespective of the absolute value of the difference calculated exceeding the threshold, a difference signal that is a function of the difference calculated, the difference signal being indicative of the sensing resolution.

4. The method of claim 1, wherein the sensing the first voltage drop and the second voltage drop comprises sensing the first voltage drop and the second voltage drop using first signal sensing circuitry and second signal sensing circuitry, the first signal sensing circuitry and the second signal sensing circuitry comprising a first analog-to-digital converter and a second analog-to-digital converter; and wherein the comparing the absolute value of the difference calculated with the threshold comprises applying mutually independent reference voltages to the first analog-to-digital converter and the second analog-to-digital converter, wherein the absolute value of the difference calculated exceeding the threshold is indicative of the faulty condition of the different between the first voltage drop and the second voltage drop.

5. The method of claim 1, further comprising operating the control device in a normal operating mode where the control device senses voltages across the cells in the battery pack with electrical charge exchanged therebetween via a first charge distribution pin and, a second charge distribution pin, wherein the self-test procedure is performed during operation in the normal operating mode.

6. A control device for a battery management system, the control device comprising:

an ordered sequence of charge-sensing pins arranged in a plurality of pairs of charge-sensing pins in an ordered sequence of odd- and even-numbered pairs of charge-sensing pins, the charge sensing pins in each pair of charge-sensing pins in the plurality of pairs of charge-sensing pins configured to be coupled to a respective cell of cells in a battery pack to sense a voltage across the respective cell, wherein each odd-numbered pair of charge-sensing pins shares a common charge sensing pin with the subsequent even-numbered pair of charge-sensing pins in the ordered sequence of odd- and even-numbered pairs of charge-sensing pins and each even-numbered pair of charge-sensing pins shares a common charge sensing pin with a previous odd-numbered pair of charge-sensing pins in the ordered sequence of odd- and even-numbered pairs of charge-sensing pins, wherein each odd-numbered pair of charge-sensing pins and the subsequent even-numbered pair of charge-sensing pins in the ordered sequence of odd- and even-numbered pairs of charge-sensing pins comprise a charge distribution pin configured to be coupled to the charge sensing pin of the even-numbered pair of charge-sensing pins other than the common charge sensing pin;

signal sensing circuitry configured to sense a first voltage drop between the charge sensing pin of the subsequent even-numbered pair other than the common charge sensing pin and the common charge sensing pin, and a second voltage drop between the charge distribution pin coupled to the charge sensing pin of the subsequent even-numbered pair other than the common charge sensing pin and the common charge sensing pin; and a processor circuit configured to calculate a difference between the first voltage drop and the second voltage drop sensed, to compare an absolute value of the difference calculated with a threshold, and to determine a faulty condition as a result of the absolute value of the difference calculated exceeding the threshold.

7. The control device of claim 6, wherein the signal sensing circuitry comprises a first signal sensing circuit and a second signal sensing circuit; and wherein the processor circuit is configured to determine the faulty condition by determining the faulty condition for both the first signal sensing circuit and the second signal sensing circuits as a result of the absolute value of the difference calculated exceeding the threshold.

8. The control device of claim 6, wherein the signal sensing circuitry has a sensing resolution; and wherein the processor circuit is further configured to issue, irrespective of the absolute value of the difference calculated exceeding the threshold, a difference signal that is a function of the difference calculated, the difference signal being indicative of a sensing resolution.

9. The control device of claim 6, wherein the signal sensing circuitry comprises a first analog-to-digital converter and a second analog-to-digital converter; and wherein the processor circuit is configured to compare the absolute value of the difference calculated with the threshold by applying mutually independent reference voltages to the first analog-to-digital converter and second analog-to-digital converter, wherein the absolute value of the difference calculated exceeding the threshold is indicative of the faulty condition of the difference between the first voltage drop and the second voltage drop.

10. The control device of claim 6, wherein the control device is configured to operate in a normal operating mode where the control device is used to sense voltages across the cells in the battery pack with electrical charge exchanged therebetween via a first charge distribution in and a second charge distribution pin, and wherein the control device is configured to perform a self-test procedure during operation in the normal operating mode, the self-test procedure used to determine the faulty condition.

11. An electrically powered vehicle, comprising:
a battery pack comprising a plurality of electrical battery cells;
a battery management system coupled to the battery pack; and
the control device according to claim 6, the control device configured to control the battery management system.

12. A method of operating a battery management system, the method comprising:
sensing a first voltage drop between a first terminal of a first battery cell and a second terminal of the first battery cell;
sensing a second voltage drop between a charge distribution pin and the second terminal of the first battery cell, the charge distribution pin coupled to the first terminal of the first battery cell through a resistor;
calculating a difference between the first voltage drop and the second voltage drop;
comparing an absolute value of the difference between the first voltage drop and the second voltage drop with a threshold; and
determining a faulty condition when the absolute value of the difference between the first voltage drop and the second voltage drop exceeds the threshold.

13. The method of claim 12, further comprising:
sensing a third voltage drop between a first terminal of a second battery cell and a second terminal of the second battery cell, the second terminal of the second battery cell being coupled to the first terminal of the first battery cell;
sensing a fourth voltage drop between the charge distribution pin and the second terminal of the second battery cell;
calculating a difference between the third voltage drop and the fourth voltage drop;
comparing an absolute value of the difference between the third voltage drop and the fourth voltage drop with the threshold; and
determining the faulty condition when the absolute value of the difference between the third voltage drop and the fourth voltage drop exceeds the threshold.

14. The method of claim 12, wherein the method is performed by a control device comprising:
an ordered sequence of charge-sensing pins arranged in a plurality of pairs of charge-sensing pins in an ordered sequence of odd- and even-numbered pairs of charge-sensing pins, the charge sensing pins in each pair of charge-sensing pins in the plurality of pairs of charge-sensing pins configured to be coupled to a respective cell of cells in a battery pack to sense a voltage across the respective cell;
wherein each odd-numbered pair of charge-sensing pins shares a common charge sensing pin with the subsequent even-numbered pair of charge-sensing pins in the ordered sequence of odd- and even-numbered pairs of charge-sensing pins and each even-numbered pair of charge-sensing pins shares a common charge sensing pin with a previous odd-numbered pair of charge-sensing pins in the ordered sequence of odd- and even-numbered pairs of charge-sensing pins;
wherein each odd-numbered pair of charge-sensing pins and the subsequent even-numbered pair of charge-sensing pins in the ordered sequence of odd- and even-numbered pairs of charge-sensing pins comprise a charge distribution pin configured to be coupled to the charge sensing pin of the even-numbered pair of charge-sensing pins other than the common charge sensing pin; and
wherein the first terminal and the second terminal of the first battery cell are coupled to a first numbered pair of charge-sensing pins and the first terminal and the second terminal of the second battery cell are coupled to a subsequent numbered pair of charge-sensing pins.

15. The method of claim 14, wherein the control device further comprises signal sensing circuitry performs the sensing steps and a processor circuit that performs the calculating step, the comparing step and the determining step.

16. The method of claim 14, further comprising operating the control device in a normal operating mode where the control device senses voltages across battery cells in a battery pack with electrical charge exchanged therebetween via a first charge distribution pin and a second charge distribution pin, wherein a self-test procedure is performed during operation in the normal operating mode, the self-test procedure used to determine the faulty condition.

17. The method of claim 12, wherein the sensing the first voltage drop and the second voltage drop comprises sensing the first voltage drop and the second voltage drop using first signal sensing circuitry and second signal sensing circuitry; and
wherein the determining the faulty condition comprises determining the faulty condition for both the first signal sensing circuitry and the second signal sensing circuitry as a result of the absolute value of the calculated difference exceeding the threshold.

18. The method of claim 12, wherein the sensing the first voltage drop and the second voltage drop comprises sensing the first voltage drop and the second voltage drop using first signal sensing circuitry and second signal sensing circuitry, each one of the first signal sensing circuitry and the second signal sensing circuitry having a sensing resolution; and
wherein the method further comprising issuing, irrespective of the absolute value of the difference calculated exceeding the threshold, a difference signal that is a function of the difference calculated, the difference signal being indicative of the sensing resolution.

19. The method of claim 12, wherein the sensing the first voltage drop and the second voltage drop comprises sensing the first voltage drop and the second voltage drop using first signal sensing circuitry and second signal sensing circuitry, each one of the first signal sensing circuitry and the second signal sensing circuitry comprising a first analog-to-digital converter and a second analog-to-digital converter; and wherein the comparing the absolute value of the difference calculated with the threshold comprises applying mutually independent reference voltages to the first analog-to-digital converter and the second analog-to-digital converter, wherein the absolute value of the difference calculated exceeding the threshold is indicative of the faulty condition of the reference voltages.

\* \* \* \* \*